(12) United States Patent
Toyoda

(10) Patent No.: US 7,776,397 B2
(45) Date of Patent: Aug. 17, 2010

(54) PROCESS FOR PRODUCING CHEMICAL ADSORPTION FILM AND CHEMICAL ADSORPTION FILM

(75) Inventor: Naoyuki Toyoda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 1078 days.

(21) Appl. No.: 11/184,913

(22) Filed: Jul. 20, 2005

(65) Prior Publication Data

US 2006/0019034 A1  Jan. 26, 2006

(30) Foreign Application Priority Data

Jul. 26, 2004  (JP) .............................. 2004-217069

(51) Int. Cl.
*B05D 3/12* (2006.01)
(52) U.S. Cl. .................... 427/301; 427/322; 427/430.1; 438/780
(58) Field of Classification Search .............. 427/430.1, 427/322, 301; 438/780
See application file for complete search history.

(56) References Cited

U.S. PATENT DOCUMENTS

| | | | |
|---|---|---|---|
| 5,238,746 A * | 8/1993 | Soga et al. .................. 428/420 |
| 5,246,740 A | 9/1993 | Mino et al. | |
| 5,338,579 A | 8/1994 | Ogawa et al. | |
| 5,449,554 A | 9/1995 | Ogawa | |
| 5,451,459 A * | 9/1995 | Ogawa et al. ................ 428/333 |
| 5,599,695 A | 2/1997 | Pease et al. | |
| 5,831,070 A | 11/1998 | Pease et al. | |
| 5,959,098 A | 9/1999 | Goldberg et al. | |
| 5,970,381 A | 10/1999 | Ohno et al. | |
| 6,239,273 B1 | 5/2001 | Pease et al. | |
| 6,307,042 B1 | 10/2001 | Goldberg et al. | |
| 6,667,075 B2 | 12/2003 | Kitazoe et al. | |
| 6,667,394 B2 | 12/2003 | Pease et al. | |
| 6,706,875 B1 | 3/2004 | Goldberg et al. | |
| 2003/0175409 A1 | 9/2003 | Pease et al. | |
| 2004/0105932 A1 | 6/2004 | Goldberg et al. | |
| 2005/0181396 A1 | 8/2005 | Goldberg et al. | |
| 2005/0181431 A1 | 8/2005 | Goldberg et al. | |
| 2005/0239295 A1 * | 10/2005 | Wang et al. .................. 438/780 |
| 2006/0008840 A1 | 1/2006 | Goldberg et al. | |
| 2006/0088038 A1 | 4/2006 | Ravula et al. | |
| 2006/0160099 A1 | 7/2006 | Goldberg et al. | |
| 2007/0011236 A1 | 1/2007 | Ravula | |

FOREIGN PATENT DOCUMENTS

| JP | A 2000-508542 | 7/2000 |
| JP | A 2000-282240 | 10/2000 |
| WO | WO 97/39151 | 10/1997 |

* cited by examiner

*Primary Examiner*—Michael Barr
*Assistant Examiner*—Ryan Schiro
(74) *Attorney, Agent, or Firm*—Oliff & Berridge, PLC

(57) ABSTRACT

The process for forming a chemical adsorption film of the present invention includes a hydrophilic treatment step ST1 of making the surface of the material hydrophilic, a treatment step ST2 of adhering an acid or a base onto the surface of the base material which is made hydrophilic, and a film forming step ST3 of contacting the surface of the base material on which an acid or a base is adhered with a chemical adsorbent to form a chemical adsorption film on the surface.

9 Claims, 7 Drawing Sheets

PROCESS FOR PRODUCING CHEMICAL ADSORPTION FILM AND CHEMICAL ADSORPTION FILM

BACKGROUND OF THE INVENTION

1. Field of the Invention

The present invention relates to process for producing a chemical adsorption film, and a chemical adsorption film. Priority is claimed on Japanese Patent Application No. 2004-217069, filed Jul. 26, 2004, the content of which is incorporated herein by reference.

2. Description of Related Art

Hitherto, as a treatment for modifying the surface of a substance, a method for imparting liquid repellency (water repellency) by coating the surface with a chemical adsorption film which consists of a fluorine containing silane coupling agent, etc., has been well known. A silane coupling agent forms a chemical adsorption film constituted by several layers of molecules, and a technology of a self assembling monolayer (SAM; Self Assembling Monolayer) which is obtained by densifying the chemical adsorption film is also well known.

Recently, as is disclosed, for example, in patent document 1 (Provisional Japanese Patent Application Publication No. 2000-282240), it is proposed to form plural domains each of which has surface properties being different from each other, on the surface of a base material by patterning a chemical adsorption and to use this for manufacturing electronic devices.

Incidentally, as a method for forming the above chemical adsorption film on the surface of the base material, hitherto, a liquid phase method or a gaseous phase method is used. For example, in the case in which a silane coupling agent is prepared by the liquid phase method, a base material which is subjected to hydrophilic treatment is immersed in a silane coupling agent solution to form a chemical adsorption film of the silane compling agent. On the other hand, in the case in which a silane coupling agent is prepared by the gaseous phase method, a base material which is subjected to hydrophilic treatment is exposed to a silane coupling agent vapor to form a chemical adsorption film of the silane compling agent.

However, in either of the liquid phase method or the gaseous phase method, it takes a long time to form a chemical adsorption film, and further, there is a problem that when pretreatment (hydrophilic treatment) on the surface of the base material is insufficient, unevenness generates in the chemical adsorption film.

Moreover, if molecules of the silane coupling agent are macromolecules, the reactivity with the surface of the base material is poor, and hence it takes a long time to form a chemical adsorption film, thereby making film formation still more difficult.

SUMMARY OF THE INVENTION

The present invention was made in view of the problems with the above conventional technology. It is an object of the present invention to provide a chemical adsorption film which is provided with a uniform film thickness and is firmly adhered to the surface of a base material, and a process for producing the chemical adsorption film on the surface of the base material in a short time at high efficiency.

In order to solve the above problems, the present invention provides a process for forming a chemical adsorption film on the surface of a base material, including: a treatment step of adhering an acid or a base onto a surface of the base material, and a film forming step of contacting the base material after the treatment step with a chemical adsorbent to adhere the chemical adsorbent onto the surface of the base material.

Thus, according to this process in which an acid or a base is adhered to the surface of the base material before a chemical adsorbent is adhered thereto, combination of the chemical adsorbent with the surface of the base material is promoted, thereby forming a chemical adsorption film which is bound to the surface of the base material strongly in a short time, and efficiently.

The chemical adsorbent applied in the present invention is a compound which forms a covalent bond with the surface of the base material through contact with the base material, and typically is a compound which is equipped with a hydrolysable functional group in its molecular structure. In the present invention, the hydrolysis reaction of the above functional group is promoted by the acid or the base which is adhered in the treatment step, thereby forming a compact chemical adsorption film in a short time.

In the process for producing a chemical adsorption film of the present invention, the above film forming step may be a step of immersing the above base material in a chemical adsorbent solution. Moreover, the above film forming step may be a step of contacting the above base material surface with a vapor of the chemical adsorbent.

According to the present invention, even when it is applied to either of the above film forming steps, a chemical adsorbent can be combined with the surface of the base material in a short time and efficiently.

In the process for producing a chemical adsorption film of the present invention, it is preferred to use a base material which has a hydrophilic group on the surface, and a chemical adsorbent which has a functional group which reacts with a hydrophilic group at an end. According to this production process, since the functional group of the chemical adsorbent reacts with the hydrophilic group on the surface of the base material to form a strong combination, a chemical adsorption film which is excellent in mechanical properties, such as peeling tolerance, can be formed. Moreover, since the reaction of the hydrophilic group of the above base material and the functional group of the chemical adsorbent is promoted by the acid or the base adhered during the above treatment step, a compact and uniform chemical adsorption film can be formed in a short time.

In the process for producing a chemical adsorption film of the present invention, hydrophilic treatment can be performed on the surface of the base material before the treatment step. According to this production process, even if the surface of the base material is not hydrophilic, the surface of the base material can obtain the adherence of a chemical adsorbent due to the hydrophilic treatment, thereby forming a compact and uniform chemical adsorption film, without being limited by the nature of the material and the surface state of the base material.

In the process for producing a chemical adsorption film of the present invention, it is preferred that the above chemical adsorbent is one or more selected from the group consisting of a silyl group (—SiX), a titanyl group (—TiX), and a satnnyl group (—SnX) (in the formulae, X represents a halogen or an alkoxy group) on the end of the molecule.

The above X group is a halogen group (Cl, Br, F, I, etc.), or an alkoxy group, etc., which has hydrolysable performance, specifically, a chlorosilyl group (—SiCl), a chlorotitanyl group (—TiCl), a chlorostannyl group (—SnCl), a methoxy silyl group (—SiOCH$_3$), an ethoxy silyl group (—SiOCH$_2$CH$_3$), a methoxy titanyl group (—TiOCH$_3$), an ethoxy titanyl group (—TiOCH$_2$CH$_3$), a methoxy stannyl group (—SnOCH$_3$), or an ethoxy stannyl group (—SnOCH$_2$CH$_3$), etc.

By the use of a chemical adsorbent which has a molecular structure such as in the above, it is possible to obtain a chemical adsorption film which is strongly combined to the surface of the base material thorough a hydrolysis reaction, and in particular, it is preferable for imparting a variety of types of surface characteristics by the chemical adsorption film, such as water repellency, oil repellency, hydrophilicity, oleophilicicy, adhesiveness, fog resistance, antifouling property, durability, etc.

In the process for forming a chemical adsorption film of the present invention, the treatment step is preferably a step of supplying acid or base solution onto the surface of the base material. If such a treatment step is adopted, then it becomes possible to adhere an acid or a base onto the surface of the base material very easily, without complicating the process, thereby facilitating the formation of the chemical adsorption film.

Next, the chemical adsorption film of the present invention is a chemical adsorption film including a base material and a chemical adsorbent combined to the surface of the base material, wherein the base material has an acid or a base on the surface thereof.

Moreover, the chemical adsorption film of the present invention is a chemical adsorption film formed by the process mentioned above.

According to such a constitution, it is possible to provide a chemical adsorption film which is compact, uniform in thickness and excellent in mechanical properties, at low cost.

Moreover, the present invention provides a process for producing a device, including the process for forming a chemical adsorption film of the present invention. According to such a process for producing a device, a uniform and compact chemical adsorption film can be formed on a desired surface of the base material quickly, using the process for forming a chemical adsorption film of the present invention, and hence it is possible to form elements, wiring, etc., at high accuracy, using the chemical adsorption film, and further, the time and costs required for producing a device can be reduced. As such a process for producing a device, for example, production of a circuit board which includes a step of forming wiring patterns on a substrate, production of a semiconductor device which includes a step of forming patterns of electrodes for capacitors and memory elements on a substrate, and production of an electro-optical device which includes a step of forming a laminate consisting of an organic functional layer are exemplary.

Furthermore, the present invention provides a device produced by the above process for producing a device. According to such a constitution, it is possible to provide a high quality device obtained by the above process for producing a device, at a low cost.

DETAILED DESCRIPTION OF THE INVENTION

Although preferred embodiments of the present invention will be explained hereinafter, referring to drawings, the present invention is not limited to the following embodiments or Working Examples.

(Process for Forming a Chemical Adsorption Film)

Figure 1:
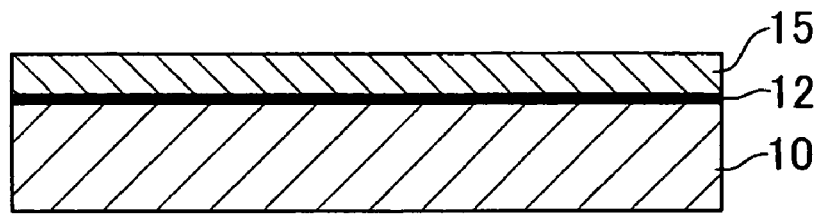
FIG. 1 is a cross-sectional view of a chemical adsorption film according to the preferred embodiment.
Figure 2:
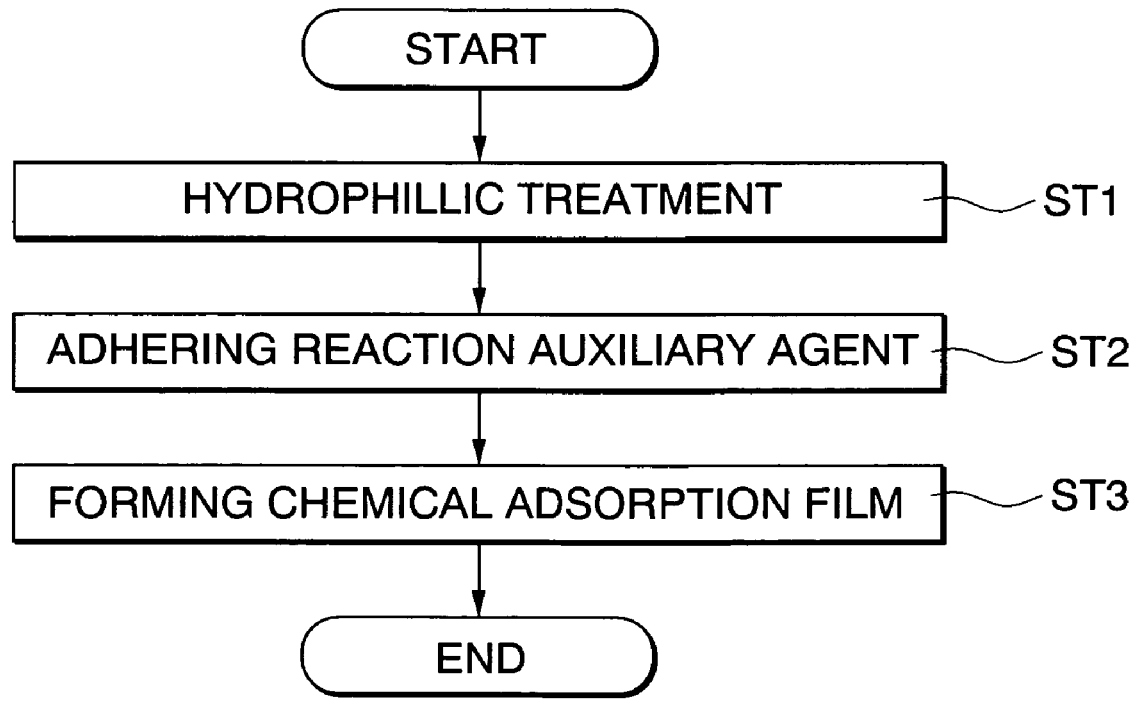
FIG. 2 is a flow chart showing a process for forming the embodiment.

FIG. 1 is a cross-sectional view showing a chemical adsorption film of the present invention which covers the surface of a base material, and FIG. 2 is a flow chart showing a process for forming a chemical adsorption film of this embodiment.

As shown in FIG. 1, a chemical adsorption film 15 is formed on the surface of a base material 10 to cover the surface thereof, with intervening a reaction auxiliary agent 12 which consists of an acid or a base adhered to the surface of the base material 10 therebetween. As shown in FIG. 2, the process for forming the chemical adsorption film 15 includes a hydrophilic treatment step ST1 of making the surface of the base material 10 hydrophilic, a treatment step ST2 of adhering a reaction auxiliary agent 12 consisting of an acid or a base to the surface of the base material 10, and a film forming step ST3 of adhering a chemical adsorbent onto the base material 10, on which the reaction auxiliary agent 12 is applied, to form a chemical adsorption film 15.

As the base material 10, various materials, such as ceramics, metal, resin, semiconductor, wood, or fiber, etc., can be used. As a specific item of the base material using such material, for example, a substrate used for manufacturing various devices, cutlery such as a cutting tool or a kitchen knife, a container such as pottery or tableware, a mirror, a molded good for various fabrication, cookware, resin product, building material, a stone, etc. are exemplary.

As the chemical adsorbent for forming the chemical adsorption film 15, organic compounds which combine with the surface of the base material 10 through a covalent bond are exemplary. That is, a chemical with the molecular structure shown in the following formula (I) can be used as the chemical adsorbent. In formula (I), Y represents an adsorptive group, R$^1$ and R$^2$ represent organic groups, X$^1$ represents a hydrolysable group, —OR$^1$, —OR$^2$, —Cl, or —OH, etc., R$^2$ represents an alkyl group having 1 to 4 carbon numbers, and "a" represents an integer of 1 to 3.

$$R^1YX^1{}_aR^2{}_{(3-a)} \tag{I}$$

The above adsorption site Y is, although not restricted in particular, preferably one or more selected from a silyl group (—Si≡), a titanyl group (—Ti≡), and a stannyl group (—Sn≡).

For example, as one which contains a silyl group, a silanol group (—Si(OH)$_3$), a trichloro silyl group (—SiCl$_3$), a triethoxy silyl group (—Si(OCH$_2$CH$_3$)$_3$), and a trimethoxy silyl group (—Si(OCH$_3$)$_3$), etc., are exemplary.

It should be noted that the structure of the adsorption site Y, the hydrolysable group $X^1$, and the organic group $R^2$ can be replaced with a structure including a hydrolysable group, such as a thiol group (—SH), a hydroxyl group (—OH), an amino group (—NH$_2$), a phosphate group (—PO$_3$H$_2$), a carboxyl group (—COOH), a sulfonic acid group (—SO$_3$H), a phospho chloride group (—PO$_2$Cl$_2$), a carboxylic acid chloride group (—COCl), or a sulfonic acid chloride group (—SO$_2$Cl).

The organic group $R^1$ of formula (I) is, for example, an alkyl group, an alkenyl group, an aryl group, or an aralkyl group, etc., of which a hydrogen group contained in the molecular structure may be replaced with an amino group, a carboxyl group, a hydroxyl group, a thiol group, a fluoride atom, etc., and hetero atoms, such as —O—, —S—, —NH—, and —N═, and aromatic series rings, such as a benzene, may be contained in the carbon chain. Specifically, as the organic group $R^1$, for example, a phenyl group, a benzyl group, a phenethyl group, a hydroxyl phenyl group, a chloro phenyl group, an amino phenyl group, a naphtyl group, an anthryl group, an anthracenyl group, a pyrenyl group, a thienyl group, a pyrrolyl group, a cyclohexyl group, a cyclohexenyl group, a cyclopentyl group, a cyclopentenyl group, a pyridinyl group, a methyl group, an ethyl group, an n-propyl group, an isopropyl group, an n-butyl group, an isobutyl group, a sec-butyl group, a tert-butyl group, an octadecyl group, an n-octyl group, a chloromethyl group, a methoxyetyl group, a hydroxyl ethyl group, an amino ethyl group, a cyano group, a mercapto propyl group, a vinyl group, an aryl group, an acryloxy ethyl group, a methacryloxy ethyl group, a glycidoxypropyl group, and an acetoxy group, etc., are exemplary. $X^1$ is a functional group which forms an alkoxy group, and a Si—O—Si bond, etc., and is hydrolyzed by water to be eliminated as an alcohol or an acid. As an alkoxy group, for example, a methoxy group, an ethoxy group, an n-propoxy group, an isopropoxy group, an n-butoxy group, an isobutoxy group, a sec-butoxy group, and a tert-butoxy group, etc., are exemplary.

In the compounds represented by the formula (I) in the above, silane compounds containing silyl groups are preferred. Specifically, for example, dimethyl dimethoxysilane, diethyl diethoxysilane, 1-propenyl methyl dichlorosilane, propyl dimethyl chlorosilane, propyl triethoxysilane, propyl trimethoxysilane, styril ethyl triethoxysilane, tetradecyl trichlorosilane, 3-thiocyanate propyl triethoxysilane, p-tolyl dimethyl chlorosilane, p-tolyl methyl dichlorosilane, p-tolyl trichlorosilane, p-tolyl trimethoxysilane, p-tolyl triethoxysilane, di-n-propyl di-n-propoxysilane, diisopropyl diisopropoxysilane, di-n-butyl di-n-butyloxysilane, di-sec-butyl di-sec-butyloxysilane, di-t-butyl di-t-butyloxysilane, octadecyl trichlorosilane, octadecyl metyl diethoxysilane, octadecyl triethoxysilane, octadecyl trimethoxysilane, octadecyl dimethyl chlorosilane, octadecyl methyl dichlosilane, octadecylmethoxydichlorosilane, 7-octenyldimethylchlorosilane, 7-octenyltrichlorosilane, 7-octenyltrimethoxysilane, octylmethyldichlorosilane, octyldimethylchlorosilane, octyltrichlorosilane, 10-undecenyldimethylchlorosilane, undecyltrichlorosilane, vinyldimethylchlorosilane, methyloctadecyldimethoxysilane, methyldodecyldiethoxysilane, methyloctadecyldimethoxysilane, methyloctadecyldiethoxysilane, n-octylmethyldimethoxysilane, n-octylmethyldiethoxysilane, triaconttyldimethylchlorosilane, triaconttyltrichlorosilane, methyltrimethoxysilane, methyltriethoxysilane, methyltri n-propoxysilane, methylisopropoxysilane, methyl n-butyloxysilane, methyltri sec-butyloxysilane, methyltri t-butyloxysilane, ethyltrimethoxysilane, ethyltriethoxysilane, ethyltri n-propoxysilane, ethylisopropoxysilane, ethyl n-butyloxysilane, ethyltri sec-butyloxysilane, ethyltri t-butyloxysilane, n-propyltrimethoxysilane, isobutyltrimethoxysilane, n-hexyltrimethoxysilane, hexadecyltrimethoxysilane, n-octyltrimethoxysilane, n-dodecyltrimethoxysilane, n-octadecyltrimethoxysilane, n-propyltriethoxysilane, isobutyltriethoxysilane, n-hexyltriethoxysilane, hexadecyltriethoxysilane, n-octyltriethoxysilane, n-dodecyltrimethoxysilane, n-octadecyltriethoxysilane, 2-[2-(trichlorosilyl)ethyl]pyridine, 4-[2-(trichlorosilyl)ethyl]pyridine, diphenyldimethoxysilane, diphenyldiethoxysilane, 1,3-(trichlorosilylmethyl)heptacosane, dibenzyl dimethoxysilane, dibenzyldiethoxysilane, phenyltrimethoxysilane, phenylmethyl dimethoxysilane, phenyldimethylmethoxysilane, phenyl dimethoxysilane, phenyldiethoxysilane, phenylmethyldiethoxysilane, phenyldimethylethoxysilane, benzyltriethoxysilane, benzyltrimethoxysilane, benzylmethyl dimethoxysilane, benzyldimethylmethoxysilane, benzyl dimethoxysilane, benzyldiethoxysilane, benzylmethyldiethoxysilane, benzyldimethylethoxysilane, benzyltriethoxysilane, benzyldimethoxysilane, dibenzyldiethoxysilane, 3-acetoxypropyltrimethoxysilane, 3-acryloxypropyltrimethoxysilane, aryltrimethoxysilane, aryltriethoxysilane, 4-aminobutyltriethoxysilane, (aminoethylaminomethyl)phenethyltrimethoxysilane, N-(2-aminoethyl)-3-aminopropylmethyldimethoxysilane, N-(2-aminoethyl)-3-aminopropyltrimethoxysilane, 6-(aminohexylaminopropyl)trimethoxysilane, p-aminophenyltrimethoxysilane, p-aminophenylethoxysilane, m-aminophenyltrimethoxysilane, m-aminophenylethoxysilane, 3-aminopropyltrimethoxysilane, 3-aminopropyltriethoxysilane, ω-aminoundecyltrimethoxysilane, amyltriethoxysilane, benzoxasilibindimethylester, 5-(bicycloheptenyl)triethoxysilane, bis(2-hydroxyethyl)-3-aminopropyltriethoxysilane, 8-bromooctyltrimethoxysilane, bromophenyltrimethoxysilane, 3-bromopropyltrimethoxysilane, n-butyltrimethoxysilane, 2-chloromethyltriethoxysilane, chloromethylmethyldiethoxysilane, chloromethylmethyldiisopropoxysilane, p-(chloromethyl)phenyltrimethoxysilane, chloromethyltriethoxysilane, chlorophenyltriethoxysilane, 3-chloropropylmethyldimethoxysilane, 3-chloropropyltriethoxysilane, 3-chloropropyltrimethoxysilane, 2-(4-chlorosulfonylphenyl)ethyltrimethoxysilane, 2-cyanoethyltriethoxysilane, 2-cyanoethyltrimethoxysilane, cyanomethylphenethyltriethoxysilane, 3-cyanopropyltriethoxysilane, 2-(3-cyclohexenyl)ethyltrimethoxysilane, 2-(3-cyclohexenyl)ethyltriethoxysilane, 3-cyclohexenyltrichlorosilane, 2-(3-cyclohexenyl)ethyltrichlorosilane, 2-(3-cyclohexenyl)ethyldimethylchlorosilane, 2-(3-cyclohexenyl)ethylmethyldichlorosilane, cyclohexyldimethylchlorosilane, cyclohexylethyldimethoxysilane, cyclohexylmethyldichlorosilane, cyclohexylmethyldimethoxysilane, (cyclohexylmethyl)trichlorosilane, cyclohexyltrichlorosilane, cyclohexyltrimethoxysilane, cyclooctyltrichlorosilane, (4-cyclooctenyl)trichlorosilane, cyclopentyltrichlorosilane, cyclopentyltrimethoxysilane, 1,1-diethoxy 1-cyclopenta 3-ene, 3-(2,4-dinitrophenylamino)propyltriethoxysilane, (dimethylchlorosilyl)methyl 7,7-dimethylnorpinane, (cyclohexylaminomethyl)methyldiethoxysilane, (3-cyclopentadienylpropyl)triethoxysilane, N,N-diethyl3-aminopropyl)trimethoxysilane, 2-(3,4-epoxycyclohexyl)ethyltrimethoxysilane, 2-(3,4-epoxycyclohexyl)ethyltriethoxysilane, (furfuryloxymethyl)triethoxysilane, 2-hydroxy4-(3-triethoxypropoxy)diphenylketone, 3-(p-methoxyphenyl)propylmethyldichlorosilane, 3-(p-methoxyphenyl)propyltrichlorosilane, p-(methylphenethyl)methyldichlorosilane, p-(methylphenethyl)trichlorosilane, p-(methylphenethyl)dimethylchlorosilane, 3-morpholinopropyltrimethoxysilane, (3-glycidoxypropyl)methyldiethoxysilane, 3-glycidoxypropyltrimethoxysilane, 1,2,3,4,7,7,-hexachloro 6-methyldiethoxysilyl 2-norbornene, 1,2,3,4,7,7,-hexachloro 6-triethoxysilyl2-norbornene, 3-iodo propyltrimethoxysilane, 3-isocyanatepropyltriethoxysilane, (mercaptomethyl)methyldiethoxysilane, 3-mercaptopropylmethyldimethoxysilane, 3-mercaptopropyldimethoxysilane, 3-mercaptopropyltriethoxysilane, 3-methacryloxypropylmethyldiethoxysilane, 3-methacryloxypropyltrimethoxysilane, methyl{2-(3-trimethoxysilylpropylamino)ethylamino}-3-propyonate, 7-octenyltrimethoxysilane, R—N-α-phenethylN'-triethoxysilylpropylurea, S—N-α-phenethyl N'-triethoxysilylpropylurea, phenethyltrimethoxysilane, phenethylmethyldimethoxysilane, phenethyldimethylmethoxysilane, phenethyldimethoxysilane, phenethyldiethoxysilane, phenethylmethyldiethoxysilane, phenethyldimethylethoxysilane, phenethyltriethoxysilane, (3-phenylpropyl)dimethylchlorosilane, (3-phenylpropyl)methyldichlorosilane, N-phenylaminopropyltrimethoxysilane, N-(triethoxysilylpropyl)dansylamide, N-(3-triethoxysilylpropyl)-4,5-dihydroimidazole, 2-(triethoxysilylethyl)-5-(chloroacetoxy)bicycloheptane, (S)—N-triethoxysilylpropyl o-menthocarbamate,3-(triethoxysilylpropyl)-p-nitrobenzamide,3-(triethoxysilyl)propylsac cinic anhydride, N-[5-(trimethoxysilyl)-2-aza-1-oxopentyl]caprolactam, 2-(trimethoxysilylethyl)pyridine, N-(trimethoxysilylethyl)benzyl N,N,N-trimethylammoniumchloride, phenylvinyldiethoxysilane, 3-thiocyanatepropyltriethoxysilane, (tridecafluoro-1,1,2,2,-tetrahydrooctyl) triethoxysilane, N-{3-(triethoxysilyl)propyl}phthalamic acid, (3,3,3-trifluoropropyl)methyldimethoxysilane, (3,3,3-trifluoropropyl)trimethoxysilane, 1-trimethoxysilyl 2-(chloromethyl)phenylethane, 2-(trimethoxysilyl)ethylphenylsulfonylazide, β-trimethoxysilylethyl 2-pyridine, trimethoxysilylpropyldiethylenetriaminamine, N-(3-trimethoxysilylpropyl)pyrrole, N-trimethoxysilylpropyl N,N,N-tributylammoniumbromide, N-trimethoxysilylpropyl, N,N,N-tributylammoniumchloride, N-trimethoxysilylpropyl N,N,N-trimethylammoniumchloride, vinylmethyldiethoxysilane, vinyltriethoxysilane, vinyltrimethoxysilane, vinylmethyldimethoxysilane, vinyldimethylmethoxysilane, vinyldimethylethoxysilane, vinylmethyldichlorosilane, vinylphenyldichlorosilane, vinylphenyldiethoxysilane, vinylphenyldimethylsilane, vinylphenylmethylchlorosilane, vinyltriphenoxysilane, vinyltris-t-butoxysilane, adamantylethyltrichlorosilane, arylphenyltrichlorosilane, (aminoethylaminomethyl)phenethyltrimethoxysilane, 3-aminophenoxydimethylvinylsilane, phenyltrichlorosilane, phenyldimethylchlorosilane, phenylmethyldichlorosilane, benzyltrichlorosilane, benzyldimethylchlorosilane, benzylmethyldichlorosilane, phenethyldiisopropylchlorosilane, phenethyltrichlorosilane, phenethyldimethylchlorosilane, phenethylmethyldichlorosilane, 5-(bicycloheptenyl)trichlorosilane, 5-(bicycloheptenyl)triethoxysilane, 2-(bicycloheptyl)dimethylchlorosilane, 2-(bicycloheptyl)trichlorosilane, 1,4-bis(trimethoxysilylethyl)benzene, bromophenyltrichlorosilane, 3-phenoxypropyldimethylchlorosilane, 3-phenoxypropyltrichlorosilane, t-butylphenylchlorosilane, t-butylphenylmethoxysilane, t-butylphenyldichlorosilane, p-(t-butyl)phenethyldimethylchlorosilane, p-(t-butyl) phenethyltrichlorosilane, 1,3-(chlorodimethylsilylmethyl) heptacosane, ((chloromethyl)phenylethyl) dimethylchlorosilane, ((chloromethyl)phenylethyl)methyldichlorosilane, ((chloromethyl)phenylethyl)trichlorosilane, ((chloromethyl)phenylethyl)trimethoxysilane, chlorophenyltrichlorosilane, 2-cyanoethyltrichlorosilane, 2-cyanoethylmethyldichlorosilane, 3-cyanopropylmethyldiethoxysilane, 3-cyanopropylmethyldichlorosilane, 3-cyanopropylmethyldichlorosilane, 3-cyanopropyldimethylethoxysilane, 3-cyanopropylmethyldichlorosilane, 3-cyanopropyltrichlorosilane, etc., and fluorinatedalkylsilane mentioned later are exemplary. One of these can be used or two or more can be used as a mixture.

If the silane compound in the above is used as the chemical adsorbent, the atom on the surface of the base material reacts with the silane compound directly or indirectly to combine therewith. For example, SiOH which is generated by hydrolyzing a part of hydrolysable groups of the silane compound, reacts with the atom M (or MOH etc.) on the surface to form a Si—O-M bond.

Moreover, a fluorine containing alkylsilane compound is exemplary as a chemical adsorbent which shows clear functionality like liquid repellency, other than the above-mentioned silane compound. In particular, the compound expressed by formula (1), in which $R^1$ is one expressed by perfluoro alkyl structure ($C_nF_{2n+1}$), and the compound in which the formula (1) is expressed by the formula (I) is exemplary. In the formula, n represents an integer of 1 to 14, m represents an integer from 2 to 6, and $X^1$, $R^2$ and "a" represent the same meaning as above.

$$C_nF_{2n+1}(CH_2)_mSiX^1{}_aR^2{}_{(3-a)} \qquad (I)$$

More specifically, $CF_3$—$CH_2CH_2$—$Si(OCH_3)_3$, $CF_3(CF_2)_3$—$CH_2CH_2$—$Si(OCH_3)_3$, $CF_3(CF_2)_5$—$CH_2CH_2$—$Si(OCH_3)_3$, $CF_3(CF_2)_5$—$CH_2CH_2$—$Si(OCH_3)_3$, $CF_3(CF_2)_5$—$CH_2CH_2$—$Si(OC_2H_5)_3$, $CF_3(CF_2)_7$—$CH_2CH_2$—$Si(OCH_3)_3$, $CF_3(CF_2)_{11}$—$CH_2CH_2$—$Si(OC_2H_5)_3$, $CF_3(CF_2)_3$—$CH_2CH_2$—$Si(CH_3)(OCH_3)_2$, $CF_3(CF_2)_7$—$CH_2CH_2$—$Si(CH_3)(OCH_3)_2$, $CF_3(CF_2)_8$—$CH_2CH_2$—$Si(CH_3)(OC_2H_5)_2$, and $CF_3(CF_2)_8$—$CH_2CH_2$—$Si(C_2H_5)(OC_2H_5)_2$, etc., are exemplary.

Moreover, those in which $R^1$ is what is expressed with perfluoroalkylether structure ($OC_nF_{2n+1}$) are exemplary. Specifically, for example, a compound in which formula (1) is expressed by the following general formula (II) is exemplary. In the formula, M represents an integer of 2 to 6, p represents an integer of 1 to 4, r represents an integer of 1 to 10, and $X^1$, $X^2$ and "a" express the same meaning as above.

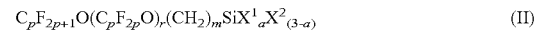

$$C_pF_{2p+1}O(C_pF_{2p}O)_r(CH_2)_mSiX^1{}_aX^2{}_{(3-a)} \qquad (II)$$

Specifically, $CF_3O(CF_2O)_6$—$CH_2CH_2$—$Si(OC_2H_5)_3$, $CF_3O(C_3F_6O)_4$—$CH_2CH_2$—$Si(OCH_3)_3$, $CF_3O(C_3F_6O)_2$ $(CF_2O)_3$—$CH_2CH_2$—$Si(OCH_3)_3$, $CF_3O(C_3F_6O)_8$—$CH_2CH_2$—$Si(OCH_3)_3$, $CF_3O(C_4F_9O)_5$—$CH_2CH_2$—$Si(OCH_3)_3$, $CF_3O(C_4F_9O)_5$—$CH_2CH_2$—$Si(CH_3)(OC_2H_5)_2$, and $CF_3O(C_3F_6O)_4$—$CH_2CH_2$—$Si(C2H5)(OCH_3)_2$, etc., are exemplary.

Figure 3:
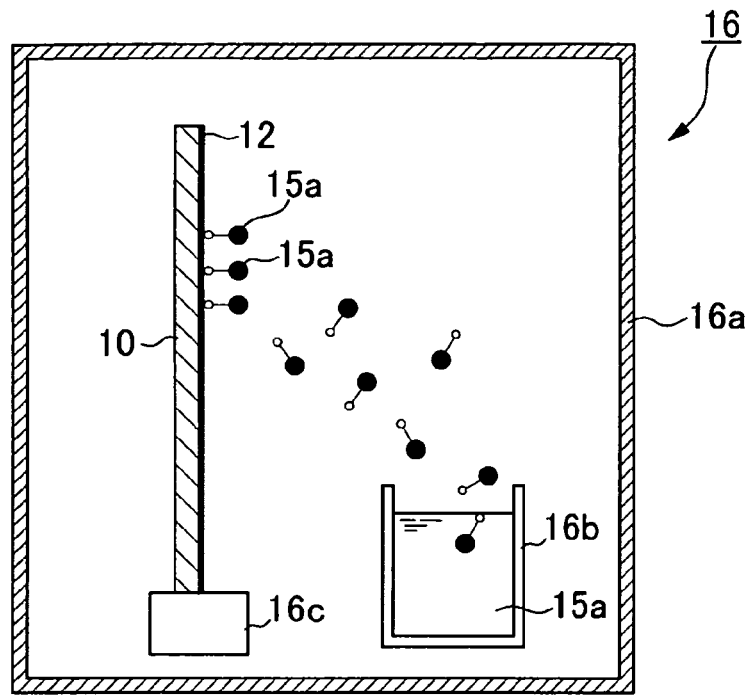
FIG. 3 is a cross-sectional view showing a forming apparatus of the chemical adsorption film using a gaseous phase method.

When forming the chemical adsorption film 15 on the base material 10, the above chemical adsorbent may be in either a gaseous phase or a liquid phase. When supplying the above chemical adsorbent in a gaseous phase, a film forming apparatus as shown in FIG. 3 can be used. This film forming apparatus 16 is equipped with an closed container 16a, and a film forming material supplying part 16b and a base material supporting part 16c accommodated in the closed container 16. While storing the above chemical adsorbent 15a in the film forming material supplying part 16b, the base material 10 is held by the base material supporting part 16c, the closed container 16a is sealed and allowed to stand under the temperature in the container, and the chemical adsorbent 15a is deposited as a film on the base material 10 to form the chemical adsorption film 15. Moreover, the time taken for forming the chemical adsorption film 15 on the base material 10 can be shortened by heating the closed container 16a. The process for forming a chemical adsorption film of the present invention enables the time for allowing it to stand to be reduced.

Figure 4:
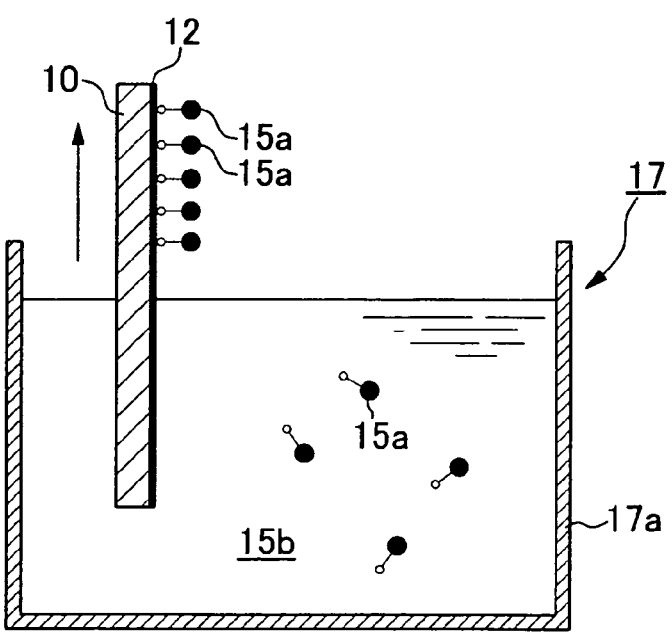
FIG. 4 is a cross-sectional view showing the forming apparatus of the chemical adsorption film using a liquid phase method.

On the other hand, when supplying the above chemical adsorbent in a liquid phase, a film forming apparatus as shown in FIG. 4 can be used, for example. This film forming apparatus 17 is equipped with an immersing bath 17a for storing the solution 15b containing the chemical adsorbent 15a therein, and it is possible to form the chemical adsorption film on the base material 10 by immersing the base material 10 into the solution 15b for a predetermined time, and thereafter pulling up the base material 10 at a predetermined rate. According to the process for forming of the present invention, the immersing time in the immersing bath 17a when using such an apparatus can be reduced.

As the solvent used when applying the chemical adsorbent to the base material 10 with using the solution 15b containing the chemical adsorbent 15a, it is preferred to use a nonaqueous type solvent, and one having a low water content is more preferred. This is because it is possible to prevent the reaction of the chemical adsorbent 15a with water contained therein, thereby increasing the operating efficiency of the chemical adsorbent 15a. As such a solvent, an aromatic series system solvent, a long chain alkyl type solvent, an alicyclic hydrocarbon type solvent, a halogen containing solvent, etc., are exemplary.

As a reaction auxiliary agent 12, an acid or a base which promotes the hydrolysis reaction of the chemical adsorbent is used.

As the acid, a protonic acid, such as hydrochloric acid, sulfuric acid, phosphoric acid, nitric acid, acetic acid, a carbonic acid, formic acid, benzoic acid, chlorous acid, hypochlorous acid, sulfurous acid, hyposulfurous acid, nitrous acid, hyponitrous acid, phosphorous acid, and hypophosphorous acid, can be used. Among these, hydrochloric acid, phosphoric acid, and acetic acid are preferred.

On the other hand, as the base, sodium hydroxide, potassium hydroxide, calcium hydroxide, etc. are exemplary. Sodium hydroxide and potassium hydroxide are preferred.

In order to form the chemical adsorption film 15 on the base material 10 according to the process for producing of this embodiment, first the surface of the base material 10 is subjected to hydrophilic treatment. The hydrophilic treatment step ST1 is suitably performed according to the surface properties of the base material 10, for example, when hydrophilic groups, such as a hydroxyl group, an aldehyde group, a ketone group, an amino group, an imino group, or a carboxyl group, are contained on the surface of the base material 10, it is possible to omit the hydrophilic treatment step ST1. As an example of hydrophilic treatment, ozone oxidation treatment, plasma polymerization, corona treatment, ultraviolet-light irradiation treatment, electron irradiation treatment, acid treatment, alkali treatment, etc., are exemplary.

Next, the reaction auxiliary agent 12 is applied to the surface of the base material 10 in the treatment step ST2. In this treatment step ST2, the reaction auxiliary agent or reaction auxiliary agent solution mentioned above is applied to the surface of the base material 10. As the application method, various methods, such as a dip coating method, an air knife coating method, a blade coating method, a spray coating method, a bar coating method, a rod coating method, a roll coating method, a photogravure coating method, a size press method, a spin coating method, a droplet discharge method, and a screen printing method, are employable, for example.

Next, the chemical adsorbent is adhered to the surface of the base material 10 on which the reaction auxiliary agent 12 is adhered. In this film forming step ST3, the above chemical adsorbent is supplied to the surface of the base material 10 by a gaseous phase method or a liquid phase method, thereby combining it with the surface of the base material 10. Here, in this embodiment, since the reaction auxiliary agent 12 consisting of an acid or a base has adhered to the surface of the base material 10 to which the chemical adsorbent is supplied, hydrolysis reaction of the chemical adsorbent is promoted so that the chemical adsorbent is combined with the surface of the base material 10 rapidly.

Thus, according to the process for forming a chemical adsorption film of the present invention, a chemical adsorption film 15 with uniform film quantity can be rapidly formed on the surface of the base material 10 by contacting the chemical adsorbent with the base material in the presence of an acid or a base which is adhered to the surface of the base material 10.

Moreover, in the present invention, since an acid or a base is adhered to the base material before the chemical adsorbent is supplied, the chemical adsorbent can be used effectively, without deteriorating the chemical adsorbent. That is, if an acid or a base is added to the solution of the chemical adsorbent used in the film forming step ST3, hydrolysis reaction of the chemical adsorbent will advance due to the presence of the acid or base, as a result, the amount of the chemical adsorbent which can adhere to the base material 10 will decrease, thereby elongating the processing time. Moreover, there is a possibility of the operating efficiency of the chemical adsorbent will deteriorate by this to increase a cost, but these problems will not occur in the present invention.

WORKING EXAMPLES

Hereinafter, Working Examples of the present invention will be explained in detail to clarify the effect thereof.

Working Example 1

Heptadecafluoro-1,1,2,2-tetra-hydrotrimethoxysilane (referred to as "FAS-17" hereinafter) was prepared as the chemical adsorbent, and a slide glass plate was prepared as the base material.

Subsequently, ultraviolet light (wavelength of 172 nm) was irradiated onto the surface of the slide glass plate to remove the organic impurities on the surface of the plate, and silanol groups (Si—OH) were formed on the surface of the plate, thereby performing hydrophilic treatment of the surface of the glass plate.

Next, 10 wt % hydrochloric acid solution was applied to the surface of the slide glass plate on which the hydrophilic treatment was performed, by a spin coat method. The conditions for application were that the number of plate rotations was 2000 rpm and the application time was 1 minute.

Next, into a closable container made of poly 4 fluorinated ethylene, a 10 ml sample bottle in which 2 μl of the above FAS-17 was stored and the slide glass plate which was subjected to hydrophilic treatment were accommodated and sealed, and thereafter the container was put in an electric furnace heated to 120° C.

Moreover, according to the same procedure as in the above, plural samples were prepared while changing the time of heating by the electric furnace.

Next, a chemical adsorption film was formed on a slide glass plate by the same way as in the above procedure with the exception of not performing the spin coating of a hydrochloric acid solution, for comparison. For this comparison sample also, plural samples were prepared while changing the time of heating by the electric furnace.

Figure 5:
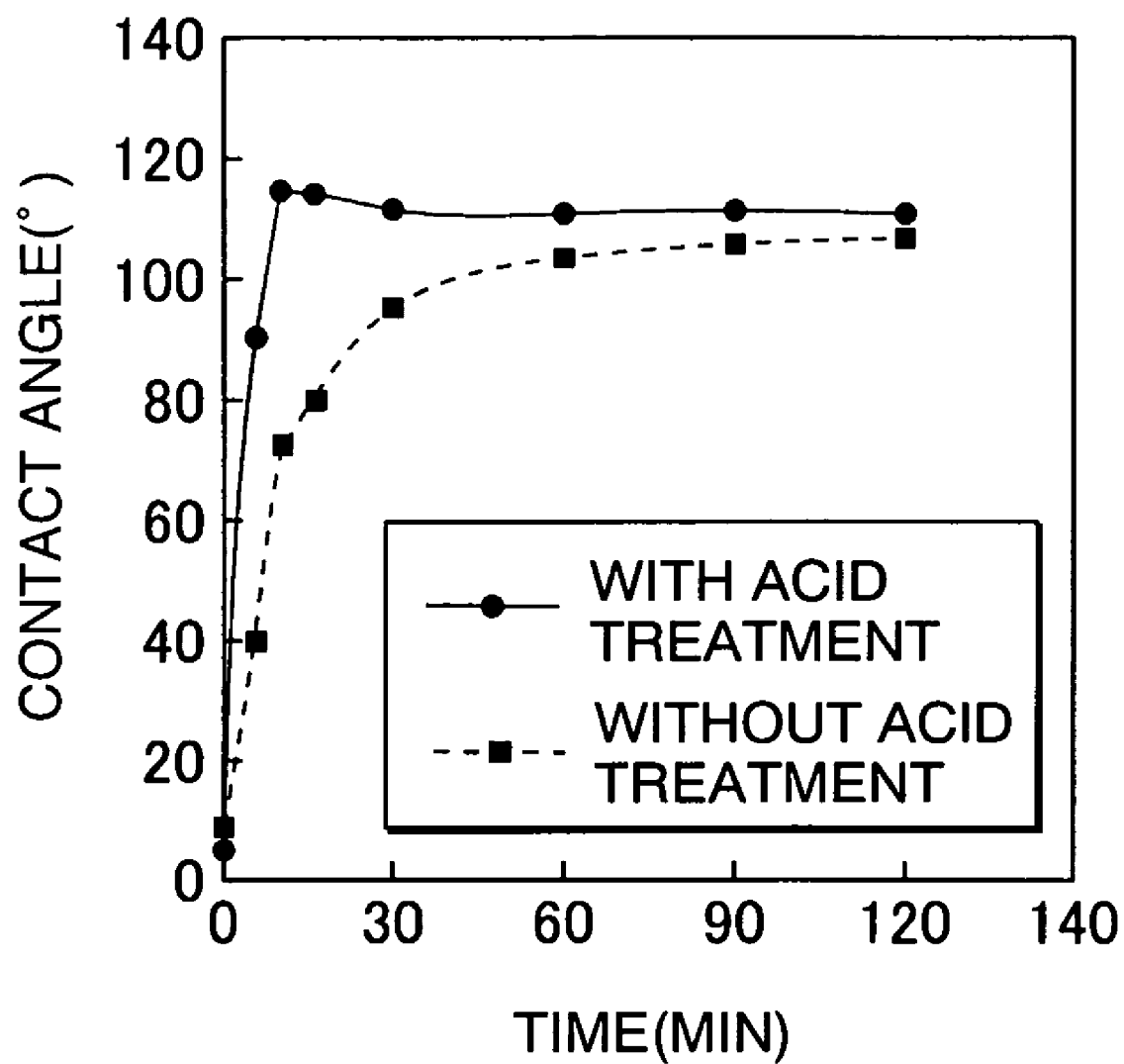
FIG. 5 is a graph which shows the measurement result of the static angle of contact of Working Example 1.

For the plural samples obtained in the above procedure, the static angle of contact over the water on the surface of the base material was measured. A graph in which the acquired angle of contact was plotted against the time of heating in the electric furnace is shown in FIG. 5. The curve "with acid treatment" in FIG. 5 shows the measurement result of the samples to which hydrochloric acid was applied, whereas the curve of "without acid treatment" in FIG. 5 shows the measurement result of the samples to which hydrochloric acid was not applied. As is clear from FIG. 5, the film forming time of the chemical adsorption film can be sharply reduced by applying hydrochloric acid to the surface of the slide glass plate before the chemical adsorbent is applied. For example, in order to form a chemical adsorption film having a contact angle of not less than 100°, it takes approximately 45 minutes in the case of "without acid treatment", whereas it takes less than 10 minutes in the case of "with acid treatment" and hence it is apparent that the adhesiveness of the chemical adsorbent is significantly improved.

Moreover, the chemical adsorption films of the samples to which the forming process of the present invention was applied were not peeled as a result of the peeling test. The chemical adsorption films formed siloxane bonds together with the surfaces of the slide glass plates, and were excellent also in mechanical strength. Moreover, when the slide glass plates after the chemical adsorption films were formed, were immersed in an acid, an alkali, an organic solvent, etc. and solvent tolerance was evaluated, change of the chemical adsorption films was not observed in any case, but it was conformed that they were very chemically stable.

Working Example 2

Octadecyltriethoxysilane (referred to as "ODS" hereinafter.) was prepared as the chemical adsorbent, and a silica glass plate was prepared as the base material.

Subsequently, the surface of the silica glass plate was washed using an ozone washing apparatus. An ozone washing apparatus is an apparatus which radiates ultraviolet light (those having a wavelength of 254 nm, and those having a wavelength of 185 nm), to generate ozone in air, and washes an object using the activity of the ozone (the organic impurities on the surface of the silica plate are removed). In addition, by this ozone washing, a silanol group (Si—OH) is formed, thereby performing a hydrophilic treatment on the surface of the silica glass plate.

Next, the silica glass plate of which surface was subjected to the hydrophilic treatment was immersed in 35 wt % hydrochloric acid solution for 10 seconds. Subsequently, dry air (dehumidified air) was blown onto the silica glass plate to dry it.

Next, the silica glass plate was immersed in 1 wt % ODS/toluene solution, and was left to stand, thereby forming a chemical adsorption film consisting of ODS on the silica glass plate.

Moreover, according to the same procedure as in the above, plural samples were prepared while changing the time of immersion into the ODS/toluene solution.

Moreover, plural samples were prepared by the same way as in the above procedure with the exception of not performing the step of immersing them in the above hydrochloric acid solution, for comparison.

The static angle of contact was measured by the same method as in Working Example 1 for each sample obtained according to the above process. As a result, it was confirmed that the samples which were immersed in a hydrochloric acid solution had a high static angle of contact as compared to the samples which were not immersed in a hydrochloric acid solution, even if the time of immersion in the ODS/toluene solution was identical. Thus, if the acid treatment is performed before forming the chemical adsorption film, the adhesiveness of the chemical absorbent to the surface of the substrate (silica plate) is significantly improved, and thereby it becomes possible to form the chemical adsorption film efficiently in a short time.

Moreover, the chemical adsorption films of the samples to which the forming process of the present invention was applied were not peeled as a result of the peeling test. The chemical adsorption films formed siloxane bonds together with the surfaces of the silica plates, and were excellent also in mechanical strength. Moreover, when the silica plates, after the chemical adsorption films were formed, were immersed in an acid, an alkali, an organic solvent, etc. and the solvent tolerance was evaluated, change of the chemical adsorption films was not observed in any case, but it was conformed that they were very chemically stable.

Working Example 3

Phenyltrimethoxysilane (referred to as "PTS" hereinafter.) was prepared as the chemical adsorbent, and a PET (polyethylene terephthalate) film was prepared as the base material.

Subsequently, the surface of the PET film was washed by oxygen plasma treatment to remove organic impurities thereon, and hydroxyl groups (—OH) or carboxyl groups (—COOH) were formed on the surface of the base material, thereby performing a hydrophilic treatment of the surface.

Next, 5 wt % sodium hydroxide solution was applied to the PET film and thus the hydrophilic treatment was performed, by a spray coating method.

Next, into a closable container made of poly 4 fluorinated ethylene, a 10 ml sample bottle in which 2 μl of the above PTS was stored and the PET film which was subjected to hydrophilic treatment were accommodated and sealed, and thereafter the container was put in an electric furnace heated to 100° C.

Moreover, according to the same procedure as in the above, plural samples were prepared while changing the time of heating by an electric furnace.

Next, a chemical adsorption film (PTS) was formed on a PET film by the same way as in the above procedure with the exception of not performing the spray coating of a sodium hydroxide solution, for comparison. For this comparison sample too, plural samples were prepared while changing the time of heating by an electric furnace.

The static angle of contact was measured by the same method as in Working Example 1 for each sample obtained according to the above process. As a result, it was confirmed that the samples which were immersed in a sodium hydroxide solution had a high static angle of contact as compared to the samples which were not immersed in a sodium hydroxide solution, even if the time of heating in the electric furnace was identical. Thus, if the basic treatment is performed before forming the chemical adsorption film, the adhesiveness of the chemical absorbent to the surface of the base material is significantly improved, and thereby it becomes possible to form the chemical adsorption film efficiently in a short time.

Moreover, the chemical adsorption film of the samples to which the forming process of the present invention applied were not peeled as a result of the peeling test. The chemical adsorption films formed siloxane bonds together with the surfaces of the base materials, and were excellent also in mechanical strength. Moreover, when the base materials after the chemical adsorption films were formed were immersed in an acid, an alkali, an organic solvent, etc. and solvent tolerance was evaluated, change of the chemical adsorption film was not observed in any case, but it was conformed that they were very chemically stable.

(Process for Producing a Device)

Next, one embodiment of a process for producing a device including a process for producing a chemical adsorption film of the previous embodiment will be explained. Hereinafter, an example of the process for producing a device will be explained, using a process for producing a wiring pattern using a liquid phase method as an example.

<Process for Producing a Wiring Pattern>

Figure 6:
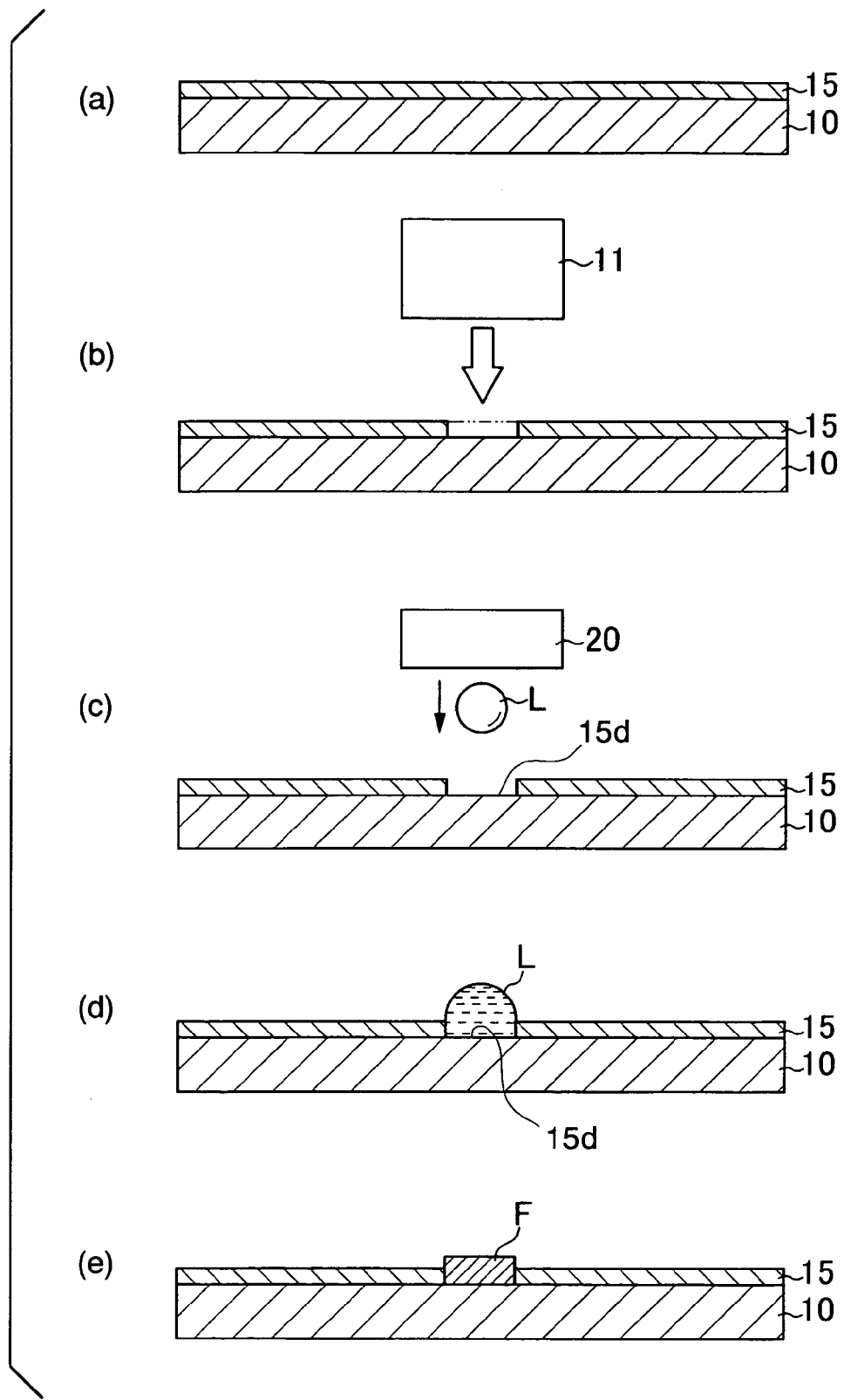
FIG. 6 is a cross-sectional flowchart showing the forming process of the wiring pattern of a preferred embodiment.

FIG. 6 is a cross-sectional diagram showing the process for forming a thin film pattern using the chemical adsorption film obtained by the producing process of the above embodiment. In this embodiment, in arranging a material for forming a wiring pattern on the base material 10, a droplet discharging method (an ink-jet method) involving discharge of droplets of a functional liquid which contains a material for forming a wiring pattern is used. In the droplet discharging method, a discharging head is arranged opposite the base material 10, and droplets of the functional liquid which contains a material for forming a wiring pattern are discharged through the discharging head to a predetermined domain to be arranged.

Figure 7:
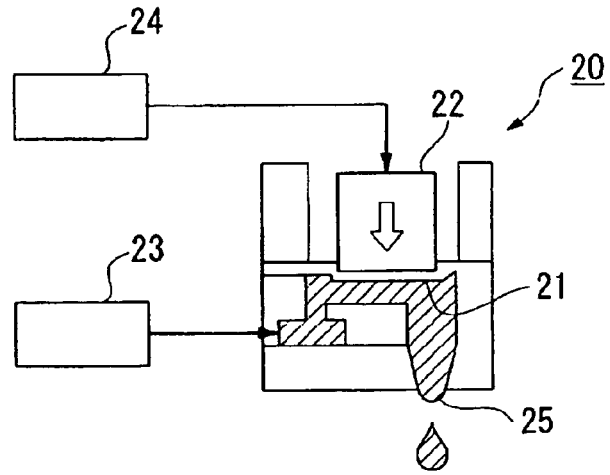
FIG. 7 is a cross-sectional view of a droplet discharge head.

Here, FIG. 7 is a figure for explaining the discharging principles of a functional liquid (liquefied material) discharged by a piezo system. In FIG. 7, a discharging head 20 is equipped with a liquid chamber 21 in which functional liquid (liquefied material containing a material for forming a wiring pattern) is accommodated, and a piezo element 22 adjoined and installed in the liquid chamber 21. The functional liquid is supplied to the liquid chamber 21 through a supplying system 23 which includes a material tank which accommodates the functional liquid. The piezo element is connected to a drive circuit 24, such that electric voltage is applied to the piezo element 22 through the drive circuit 24 to deform the piezo element 22 and change the site of the liquid chamber 21, thereby discharging the functional liquid from the discharging head 25. In this case, a deforming amount of the piezo element 22 is controlled by changing the electric voltage to be impressed. Moreover, a deforming rate of the piezo element 22 is controlled by changing the frequency of the electric voltage to apply. In the discharging of the droplets by a piezo system, the material is not heated, and hence it is advantageous in that discharging of the droplets scarcely affects the composition of the material.

As the discharging technology in the above droplet discharging method, an electrification control system, a pressurization oscillation system, an electric heat conversion system, an electrostatic suction system, and an electric machinery conversion system, etc. are exemplary. The electrification control system gives an electric charge to a material by way of an electrification electrode, and controls the dispersal direction of the material by way of a deflecting electrode, thereby discharging droplets of the material from a discharging nozzle. The pressurization oscillating system discharges a material by applying super high electric voltage of approximately 30 kg/cm$^2$ to the material, and when controlling voltage is not impressed, the material will go straight to be discharged from the discharging nozzle, whereas, when the controlling voltage is applied, electrostatic repulsion will occur within the material, and as a result, the material will disperse not to be discharged from the discharging nozzle.

The electric heat conversion system evaporates a material rapidly to generate a bubble by way of a heater disposed in the space for storing the material, and discharges the material in the space by way of the pressure of bubble. The electrostatic suction system applies minute pressure to the space where a material is stored, to form a meniscus of the material in a discharging nozzle, and pulls the material by applying electrostatic attraction in this state. The electric machinery conversion system is a system which uses the phenomenon that a piezo element (a piezo-electric element) transforms in response to an electric pulse signal, and it gives pressure to the space where a material is stored through a flexible substance, and it pushes the material out from this space to discharge the material through a discharging nozzle, by way of transformation of the piezo element. In addition, other technologies, such as a system using a viscous change of the fluid by an electric field and a system to disperse by way of electric discharge sparks, are also applicable. A droplet discharging method has the advantage that the very little material is wasted, and that material of a desired amount can be precisely disposed at a desired position. It should be noted that the amount of one droplet of the liquid material discharged by the droplet discharging method is, for example, 1 to 300 nanograms.

Hereinafter, the procedure for forming a wiring pattern will be explained.

First, as shown in FIG. 6, part (a), the chemical adsorption film 15 is formed on the surface of the base material 10. This chemical adsorption film 15 is formed through the steps ST1 to ST3 using the producing process of the present invention mentioned in the above. Moreover, liquid repellency was given to the surface of the base material 10 by the chemical adsorption film 15 in this embodiment. Therefore, the chemical adsorption film 15 is self-organizing film which consists of fluorinated alkylsilane, for example.

Next, as shown in FIG. 6, part (b), the chemical adsorption film 15 is partially removed by radiating light towards the chemical adsorption film 15 from a light source 11. As the method for removing a part of the chemical adsorption films 15, methods of radiating various lasers, such as ultroviolet lights, a Ne—He laser, an Ar laser, a $CO_2$ laser, a ruby laser, a semiconductor laser, a YAG laser, a glass laser, a $YVO_4$ laser, or an excimer laser, etc., to the part which is removed of the chemical adsorption film are exemplary.

By way of this removing step, liquid repellent domains (domains where the chemical adsorption film 15 is formed) which have liquid repellency to a liquid material applied to the surface of the base material 10 in a latter step, and lyophilic domains (domains where the chemical adsorption film 15 is removed) 15d which are lyophilic to the liquid material are formed.

Next, as shown in FIG. 6, part (c), a material disposing step which involves disposing droplets of the liquid material which contains the material for forming a wiring pattern on to the lyophilic domains 15d on the base material 10 is performed using the discharging head 20.

Here, using an organic silver compound as a conductive material which constitutes the material for forming a wiring pattern, and using diethyleneglycol diethylether as a solvent (carrier fluid), the functional liquid containing the organic silver compound is discharged.

In this material disposing step, as shown in FIG. 7, from the discharging head 20, the liquid material containing the material for forming a wiring pattern is made into droplet to be discharged. The droplet thus discharged is disposed on the lyophilic domains 15d on the base material 10, as shown in FIG. 6, part (d). At this time, since the edges of the lyophilic domain 15d are surrounded by the chemical adsorption film 15 which has liquid repellency, the droplet is prevented from flowing and spreading to domains other than the lyophilic domains 15d. Moreover, by the liquid repellency of the chemical adsorption film 15, even if a part of the discharged droplet is disposed on the chemical adsorption film 15, it flows down into the lyophilic domain 15d. Furthermore, in the lyophilic domain 15d where the base material 10 is exposed, the discharged droplet flows smoothly and spreads inside the lyophilic domain 15d, thereby being uniformly disposed in this domain because of the lyophilic performance.

It should be noted that it is also possible to use a dispersion liquid in which conductive particles are dispersed into a carrier fluid as a liquid material for forming a wiring pattern. As conductive particles, metal particles containing at least one of gold, silver, copper, aluminum, palladium, and nickel, metal oxides thereof, and particles of a conductive polymer or a superconductor, are exemplary. As the carrier fluid, those which can make the above conductive particles disperse, and do not cause condensation of particles, can be employed. Specifically, for example, water; alcohol, such as methanol, ethanol, propanol, and butanol; hydrocarbon type compounds, such as n-heptane, n-octane, decane, dodecane, tetradecane, toluene, xylene, cymene, durene, indene, dipentene, tetrahydronaphthalene, decahydronaphthalene and cyclohexyl benzene; moreover, ether type compounds such as ethyleneglycol dimethyl ether, ethyleneglycol diethyl ether, ethyleneglycol methyl ethyl ether, diethyleneglycol dimethyl ether, diethyleneglycol dethyl ether, diethyleneglycol methyl ethyl ether, 1,2-dimethoxy ethane, bis (2-methoxy ethyl) ether, and p-dioxane; and polar compounds, such as propylene carbonate, gamma-butyrolactone, N-methyl 2-pyrrolidone, dimethylform amide, dimethylsulfoxide, and cyclohexanone, are exemplary. Among these, with respect to the dispersibility of particles, the stability of the dispersion liquid, and the easiness of applicability by a droplet discharing method, water, alcohol, a hydrocarbon type compound, and an ether type compound are preferred, and water and a hydrocarbon type compound are exemplary as more preferred carrier fluids.

A calcining step is performed after the material disposing step (droplet discharging step). By performing the calcining step on the liquid material L containing a conductive material, as shown in FIG. 6, part (e), the liquid material L is dried and solidified to form a solid wiring pattern F on the base material 10, thereby developing conductivity. Particularly when using an organic silver compound, conductivity is developed by performing the calcination step to remove organic components, thereby leaving behind silver particles. Therefore, at least one of a heating treatment and an optical treatment is performed as the calcining step on the base material 10 after the material disposing step. Although the heating treatment and the optical treatment are usually performed in open air, it is also possible to perform the treatment in an inert gas atmosphere, such as nitrogen, argon, and helium, if necessary. The processing temperature in the heating treatment or the optical treatment is suitably determined in consideration of the boiling point (vapor pressure) of the solvent, kind and pressure of the atmospheric gas, dispersibility of the particles and organic silver compound, thermal action such as an oxidative performance, existence and amount of a coating material, heat-resistant temperature of the base material, etc. For example, in order to remove the organic component of an organic silver compound, calcining it at approximately 200° C. is necessary. Moreover, when using a plastic material, etc., as the base material, it is preferred to use it at a temperature of not less than room temperature and not more that 100° C.

Thus, according to the process for producing a device which includes the process for forming a chemical adsorption film of the present invention, since a base material on which a chemical adsorption film having excellent mechanical properties and fine and uniform thickness is formed can be provided for production of a device, it is possible to dispose the liquid material L on the intended domain (the lyophilic domain 15d) exactly, which enables formation of a wiring pattern having fine line width.

Moreover, according to the present invention, since the chemical adsorption film 15 forms a precise and uniform film, the contrast of the surface properties between the lyophilic domain and the liquid repellent domain can be increased, and therefore it is easily applicable to the formation of a fine wiring pattern.

Moreover, as mentioned in the above, according to the present invention, the chemical adsorption film 15 can be formed in a short time, and hence the time required for producing a device can be shortened, and as a result, it is possible to improve production efficiency and to reduce the cost of production.

In addition, after the material disposing step, and after performing an intermediate drying step (or calcining step) to remove a part or all of the carrier fluid of the liquid material L on the base material 10, it is also possible to discharge the liquid material L further to form a wiring pattern thereon. In this case, it is possible to laminate the material for forming a wiring pattern by a desired thickness on the lyophilic domain 15d, by repeating the material disposing step and the intermediate drying step (calcining step) plural times.

<Device>

Hereinafter, an embodiment of a device to which the process for forming a wiring pattern can be applied will be explained.

[Plasma Type Display]

First, a plasma type display (electrooptical apparatus) will be explained as one embodiment.

Figure 8:
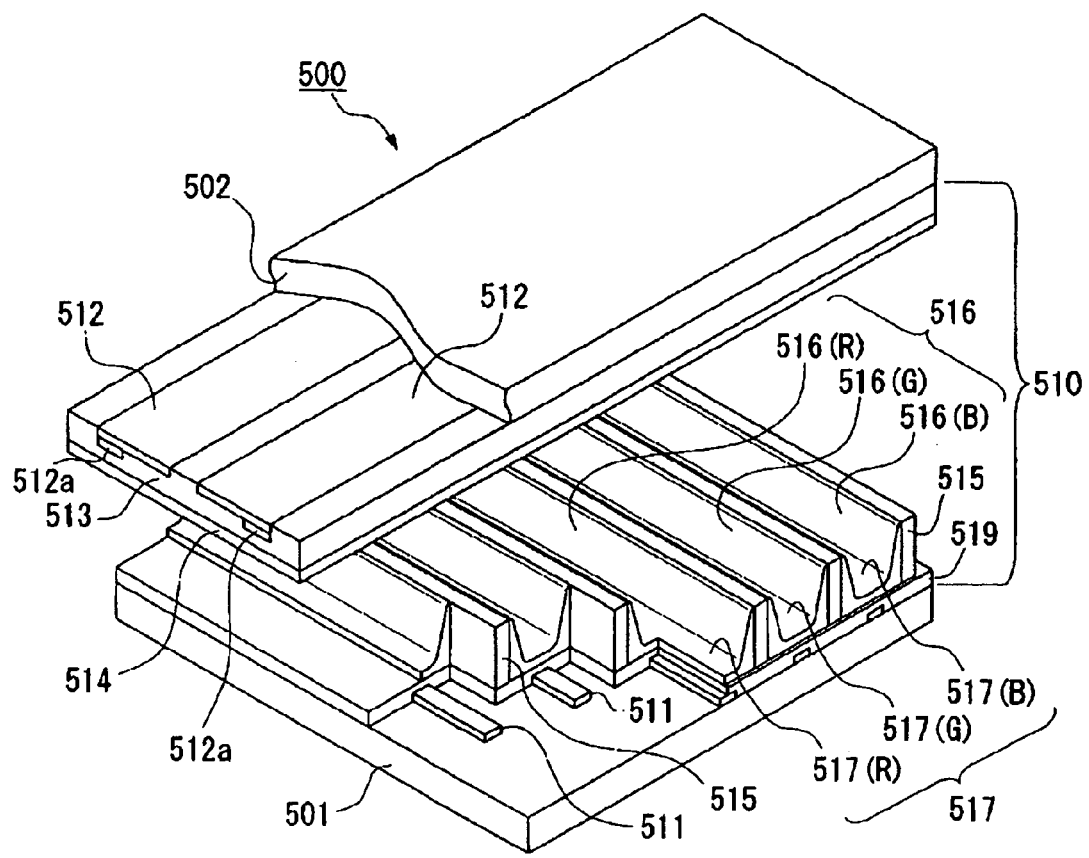
FIG. 8 is a diagonal view of a plasma display as an example of a device.

FIG. 8 shows the exploded perspective view of the plasma type display 500 of this embodiment.

The plasma type display 500 is constituted from substrates 501 and 502 which are arranged to face to each other, and an electric discharging display part 510 formed therebetween.

The electric discharging display part 510 is an aggregate of plural electric discharging cells 516. Among the plural electric discharging cells 516, every three pieces of electric discharging cells 516 consisting of a red electric discharging cell 516 (R), a green electric discharging cell 516 (G), and a blue electric discharging cell 516 (B), 516 are arranged so as to constitute one pixel of these three discharging cells.

Address electrodes 511 are formed on an upper surface of the substrate 501 in the shape of stripes at predetermined intervals, and a dielectric layer 519 is formed so as to cover the address electrodes 511 and the upper surface of the substrate 501.

On the dielectric layer 519, partitions 515 are formed so as to be located between the address electrodes 511 and run along the address electrodes 511. The partitions 515 include a partition which joins the right-and-left sides of the address electrode 511, and a partition extended in the direction which intersects perpendicularly the address electrode 511. Moreover, the electric discharging cells 516 are formed corresponding to the rectangular domains divided by the partitions 515.

Moreover, phosphors 517 are disposed inside the rectangular domains divided by the partitions 515. The phosphors 517 each emit any one of fluorescence of red, green, and blue, that is, the red phosphors 517 (R) are disposed at the bottom of the red electric discharging cells 516 (R), the green phosphors 517 (G) are disposed at the bottom of the green electric discharging cells 516 (G), and the blue phosphors 517 (B) are disposed at the bottom of the blue electric discharging cells 516 (B), respectively.

Plural displaying electrodes 512 are formed in the direction which intersects perpendicularly the address electrodes 511 at a predetermined interval in the shape of a stripe on the substrate 502. Furthermore, a protective film 514 which consists of a dielectric layer 513, MgO, etc. is formed so as to cover these.

The substrates 501 and 502 are arranged opposed to each other such that the address electrodes 511 may cross the displaying electrodes 512 at right angles and they are stuck together mutually. The address electrodes 511 and the displaying electrodes 512 are connected to an AC power supply which is not shown in drawings. By turning on electricity to each electrode, in the electric discharge displaying part 510, the phosphor 517 is excited to emit luminescence, and thereby it becomes possible to perform color displaying.

In this embodiment, since the address electrodes 511 and the displaying electrodes 512 are formed based on the process for producing a device (the process for forming a wiring pattern) mentioned above, electrodes are formed with a high accuracy of width of line, thereby forming a high quality plasma type display apparatus having improved electrical characteristics.

It should be noted that the device (electrooptical device) of the present invention is also applicable to a surface conductive type electron emission element which uses the phenomenon of electron discharge generated by passing current in parallel to the surface of a small area thin film formed on a substrate, etc., apart from the above mentioned devices. Moreover, of course, it is applicable to an electrooptics apparatus, such as a liquid crystal display and an organic electroluminescence apparatus.

[Card Medium]

Figure 9:
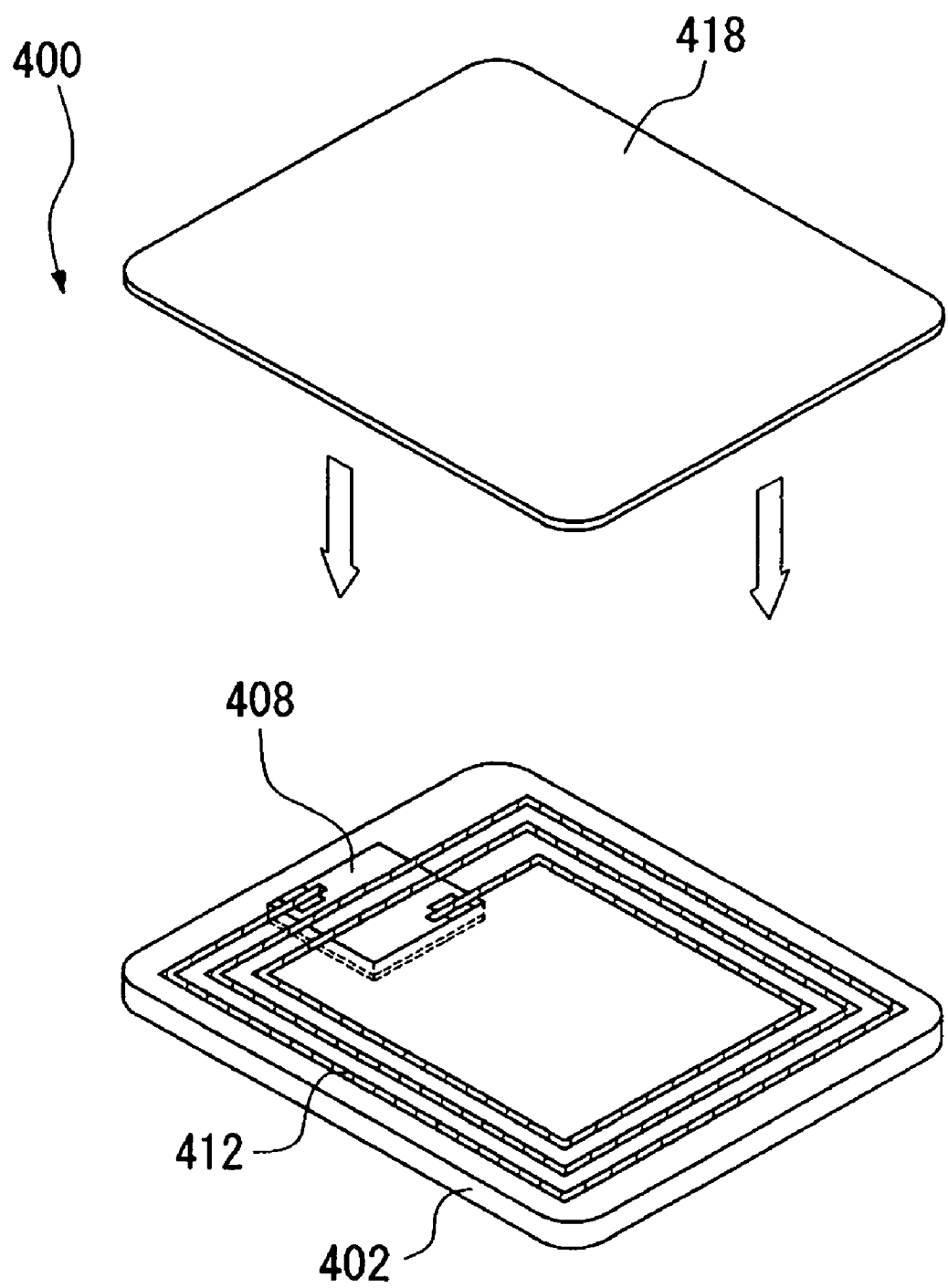
FIG. 9 is a constitutional view of a card medium as an example of a device.

Next, as a device to which the above process for forming a wiring pattern can be applied, one embodiment of a noncontact type card medium will be explained. As shown in FIG. 9, the noncontact type card medium 400 of this embodiment is constituted from a case consisting of a card base material 402 and a card cover 418, and a semiconductor integrated circuit chip 408 and an antenna circuit 412 installed in the case. The noncontact type card medium 400 performs at least one of electric power supply or data transfer by at least one of an exterior transceiver group, which is not illustrated, and an electromagnetic wave or electric capacity combination.

In this embodiment, the antenna circuit 412 is formed by the process for producing a device of the above mentioned embodiment. According to the noncontact type card medium of this embodiment, a high quality noncontact type card medium having an improved line width accuracy, uniform angle of contact, and few production steps can be obtained.

[Electric Instrument]

Figure 10A:
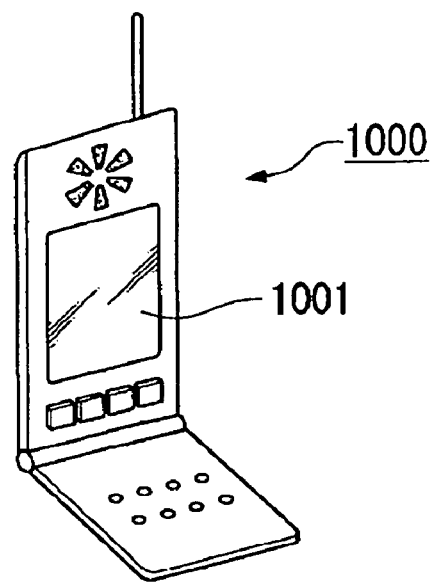
FIG. 10A is a diagonal view of a cellular phone.
Figure 10B:
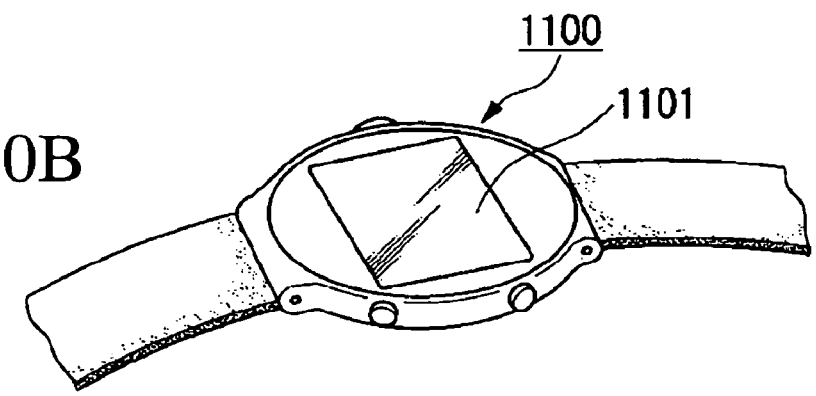
FIG. 10B is a diagonal view portable information processing instruments, such as a word processor and a personal computer.
Figure 10C:
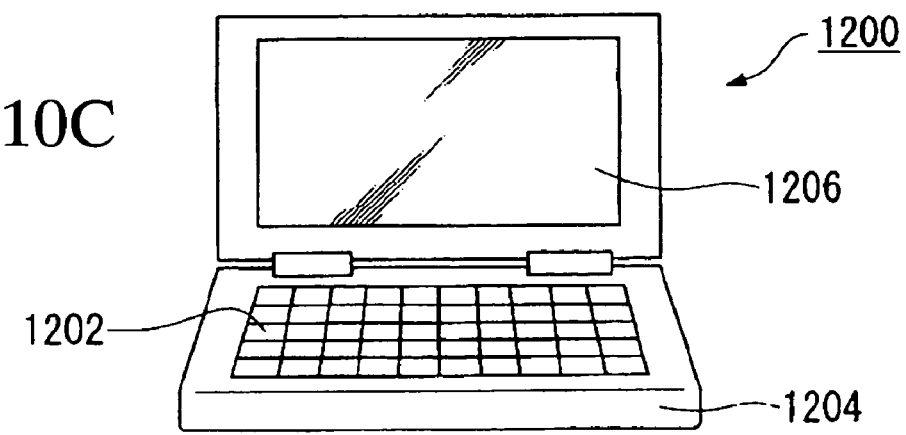
FIG. 10C is a diagonal view of a wrist watch type electric instrument.

Each device of the above embodiments can be used in a state of being installed in an electric instrument, etc. Examples will be shown below. FIG. 10A is a diagonal view which shows an example of a cellular phone. In FIG. 10A, 1000 denotes the main body of the cellular phone, and 1001 denotes the displaying part which is equipped with the displaying device of the above embodiment. FIG. 10C is a diagonal view which shows an example of portable information processing instruments, such as a word processor and a personal computer. In FIG. 10C, 1200 denotes an information processing instrument, 1202 denotes an inputting part such as a keyboard, 1204 denotes a main body of the information processing instrument, and 1206 denotes a displaying part which is equipped with the displaying device of the above embodiment. FIG. 10B is a diagonal view which shows an example of a wrist watch type electric instrument. In 10B, 1100 denotes the main body of wrist watch, and 1101 denotes the displaying part which is equipped with the displaying device of the above embodiment.

Each of the electric instruments shown in FIGS. 10A to 10C is equipped with the displaying device of the above embodiment, and hence it becomes possible to miniaturize, make thinner, and raise the quality of the devices.

It should be noted that as the above displaying device, not only a plasma type display, but a liquid crystal display, an organic electroluminescence display, an electronic discharge type display, etc. are also things to which the present invention is applicable.

What is claimed is:

1. A process for forming a chemical adsorption film on a surface of a base material, comprising:
   a hydrophilic treatment to the surface of the base material;
   after the hydrophilic treatment, a treatment step of applying an acid or a base onto the surface of the base material; and
   a film forming step of contacting the base material, after the treatment step, with a chemical adsorbent to apply the chemical adsorbent onto the surface of the base material, while maintaining the acid or the base evenly on the surface of the base material, wherein
   the acid is selected from the group consisting of hydrochloric acid, phosphoric acid, and acetic acid, and
   the base is selected from the group consisting of sodium hydroxide, potassium hydroxide, and calcium hydroxide.

2. A process for forming a chemical adsorption film as set forth in claim 1, wherein the film forming step is a step of immersing the base material in a chemical adsorbent solution.

3. A process for forming a chemical adsorption film as set forth in claim 1, wherein the film forming step is a step of contacting the surface of the base material with a vapor of the chemical adsorbent.

4. A process for forming a chemical adsorption film as set forth in claim 1, wherein the base material has a hydrophilic group on the surface thereof, and the chemical adsorbent has a functional group which is reactive with hydrophilic groups on end thereof.

5. A process for forming a chemical adsorption film as set forth in claim 4, wherein the chemical adsorbent has one or more selected from the group consisting of a silyl group (—SiX), a titanyl group (—TiX), and a stannyl group (—SnX) (in the formulae, X represents a halogen or an alkoxy group) on an end of a molecule thereof.

6. A process for forming a chemical adsorption film as set forth in claim 1, wherein the treatment step is a step of supplying a solution of the acid or the base onto the surface of the base material.

7. A process for forming a chemical adsorption film as set forth in claim 2, wherein the base material has a hydrophilic group on the surface thereof, and the chemical adsorbent has a functional group which is reactive with hydrophilic groups on end thereof.

8. A process for forming a chemical adsorption film as set forth in claim 3, wherein the base material has a hydrophilic group on the surface thereof, and the chemical adsorbent has a functional group which is reactive with hydrophilic groups on end thereof.

9. A process for forming a chemical adsorption film as set forth in claim 1, wherein
in the film forming step, a promotion of hydrolysis of the chemical adsorbent by the acid or the base is caused on the surface of the base material.

* * * * *